United States Patent
Wang et al.

(10) Patent No.: US 7,397,313 B2
(45) Date of Patent: *Jul. 8, 2008

(54) AUTO-GAIN CONTROLLED DIGITAL PHASE-LOCKED LOOP AND METHOD THEREOF

(75) Inventors: Ping-Ying Wang, Hsin-Chu (TW); Meng-Ta Yang, Miao-Li Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/675,068

(22) Filed: Feb. 14, 2007

(65) Prior Publication Data

US 2007/0132518 A1 Jun. 14, 2007

Related U.S. Application Data

(63) Continuation of application No. 11/161,079, filed on Jul. 22, 2005, now Pat. No. 7,196,588.

(51) Int. Cl.
*H03L 7/085* (2006.01)
*H03L 7/093* (2006.01)
*G11B 5/09* (2006.01)

(52) U.S. Cl. .................. 331/17; 331/25; 327/156; 360/51

(58) Field of Classification Search .............. 331/1 A, 331/8, 17, 18, 25; 327/156–159; 332/127; 360/51; 375/376; 455/260

See application file for complete search history.

(56) References Cited

U.S. PATENT DOCUMENTS 7,196,588 B2 * 3/2007 Wang et al. .................. 331/17

* cited by examiner

*Primary Examiner*—David Mis
(74) *Attorney, Agent, or Firm*—Winston Hsu

(57) ABSTRACT

A digital PLL system includes a first multiplier coupled to a phase difference signal for multiplying the phase difference signal by a first gain factor; a second multiplier coupled to the phase difference signal for multiplying the phase difference signal by a second gain factor; a digital loop filter coupled to the first multiplier and the second multiplier for providing an integral signal and a proportional signal and for generating a control signal according to the integral signal and the proportional signal; and an auto-gain control (AGC) unit coupled to the first multiplier, the second multiplier, and the digital loop filter. The AGC unit further comprises a first control unit for updating the first gain factor according to the integral signal; and a second control unit for updating the second gain factor according to the proportional signal.

21 Claims, 5 Drawing Sheets

AUTO-GAIN CONTROLLED DIGITAL PHASE-LOCKED LOOP AND METHOD THEREOF

CROSS REFERENCE TO RELATED APPLICATIONS

This continuation application claims the benefit of U.S. application Ser. No. 11/161,079, filed on Jul. 22, 2005 and included herein by reference.

BACKGROUND

The invention relates to a digital phase-locked loop (PLL), and more particularly, to a digital PLL having an auto-gain control.

In an optical disc drive, an EFM (Eight-to-Fourteen Modulation) signal read from a disc needs to be synchronized so that the EFM signal can be further processed. In general, the optical disc drive is operated under a CAV (Constant Angular Velocity) mode and therefore, a channel bit rate of the EFM signal varies as a pick-up head of the optical disc drive moves from an inner track to an outer track or from an outer track to an inner track of the disc. The channel bit rate variation appears in way of phase and frequency variations of the EFM signal. To track the channel bit rate variation of the EFM signal, a phase-locked loop (PLL) is used.

Please refer to FIG. 1. FIG. 1 is a block diagram of a conventional digital PLL circuit 100 used for tracking the EFM signal. The PLL circuit 100 includes a phase detector (PD) 110, a plurality of multipliers 120 and 130, a digital loop filter 140, and a digitally controlled oscillator (DCO) 150. As the pick-up head moves from one track to another track of a disc, phase and frequency characteristics of the EFM signal change, and a multiplier gain $G_1$ of the multiplier 120 and a multiplier gain $G_2$ of the multiplier 130 require adjustments in order to lock the EFM signal. As known to those skilled in this art, the multiplier gains $G_1$ and $G_2$ set in PLL circuit 100 are acquired from a predetermined lookup table. As the pick-up head moves, suitable settings of these gains $G_1$ and $G_2$ will be decided according to the predetermined lookup table.

In a preferred operating condition, utilizing the lookup table to perform a gain control of the multipliers 120 and 130 satisfies the needs of the optical disc drive under CAV mode. However, the pick-up head will fail to read the EFM signal if a disc was not initially recorded properly. Utilizing the lookup table is insufficient to compensate for this fault since the lookup table expects only phase and frequency variations due to a movement of the pick-up head. Therefore, no matter how many times a re-read operation of the disc is performed, the optical disc drive still fails to read the disc under the above condition.

SUMMARY

It is therefore one of the objectives of the claimed invention to provide a digital phase-locked loop (PLL) circuit having an auto-gain control and method thereof for an optical disc drive, to solve the above-mentioned problem.

The claimed invention provides a digital PLL system. The digital PLL system comprises a phase detector coupled to an input signal and a clock signal for generating a phase difference signal indicating a phase difference between the input signal and the clock signal; a first multiplier coupled to the phase detector for multiplying the phase difference signal by a first gain factor; a second multiplier coupled to the phase detector for multiplying the phase difference signal by a second gain factor; a digital loop filter coupled to the first multiplier and the second multiplier for providing an integral signal and a proportional signal according to outputs of the first multiplier and the second multiplier and for generating a control signal according to the integral signal and the proportional signal; a digitally controlled oscillator coupled to the digital loop filter for generating the clock signal according to the control signal; and an auto-gain control (AGC) unit coupled to the first multiplier, the second multiplier, and the digital loop filter. The AGC unit further comprises a first control unit for updating the first gain factor according to the integral signal; and a second control unit for updating the second gain factor according to the proportional signal.

The claimed invention provides a method for controlling a digital PLL system. The method includes generating a phase difference signal according to an input signal and a clock signal; multiplying the phase difference signal by a first gain factor through a first multiplier of the digital PLL system; multiplying the phase difference signal by a second gain factor through a second multiplier of the digital PLL system; performing digital loop filtering upon outputs of the first multiplier and the second multiplier for providing an integral signal and a proportional signal and for generating a control signal according to the integral signal and the proportional signal; generating the clock signal according to the control signal through a digitally controlled oscillator of the digital PLL system; updating the first gain factor according to the integral signal; and updating the second gain factor according to the proportional signal.

The claimed invention further provides a digital PLL system. The digital PLL system comprises a phase detector coupled to an input signal and a clock signal for generating a phase difference signal indicating a phase difference between the input signal and the clock signal; a first multiplier coupled to the phase detector for multiplying the phase difference signal by a first gain factor; a second multiplier coupled to the phase detector for multiplying the phase difference signal by a second gain factor; a digital loop filter coupled to the first multiplier and the second multiplier for providing an integral signal and a proportional signal according to outputs of the first multiplier and the second multiplier and for generating a control signal according to the integral signal and the proportional signal; a digitally controlled oscillator coupled to the digital loop filter for generating the clock signal according to the control signal; and an auto-gain control (AGC) unit coupled to the first multiplier, the second multiplier, and the digital loop filter. The AGC unit further comprises a first control unit for updating the first gain factor according to the integral signal; and a second control unit for updating the second gain factor according to the phase difference signal.

The claimed invention provides a method for controlling a digital PLL system. The method includes generating a phase difference signal according to an input signal and a clock signal; multiplying the phase difference signal by a first gain factor through a first multiplier of the digital PLL system; multiplying the phase difference signal by a second gain factor through a second multiplier of the digital PLL system; performing digital loop filtering upon outputs of the first multiplier and the second multiplier for providing an integral signal and a proportional signal and for generating a control signal according to the integral signal and the proportional signal; generating the clock signal according to the control signal through a digitally controlled oscillator of the digital PLL system; updating the first gain factor according to the integral signal; and updating the second gain factor according to the phase difference signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
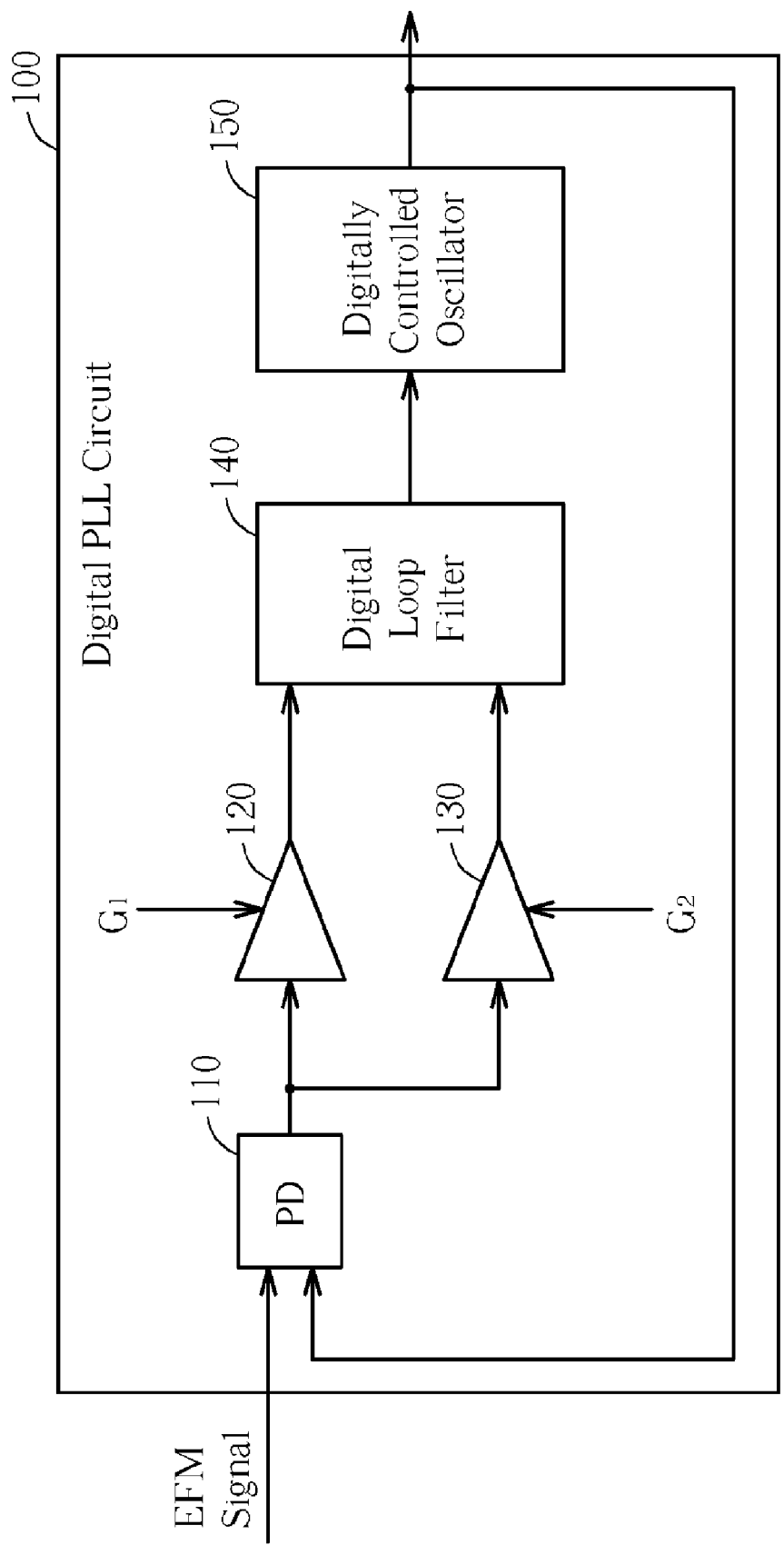
FIG. 1 is a block diagram illustrating a conventional digital phase-locked loop circuit.
Figure 2:
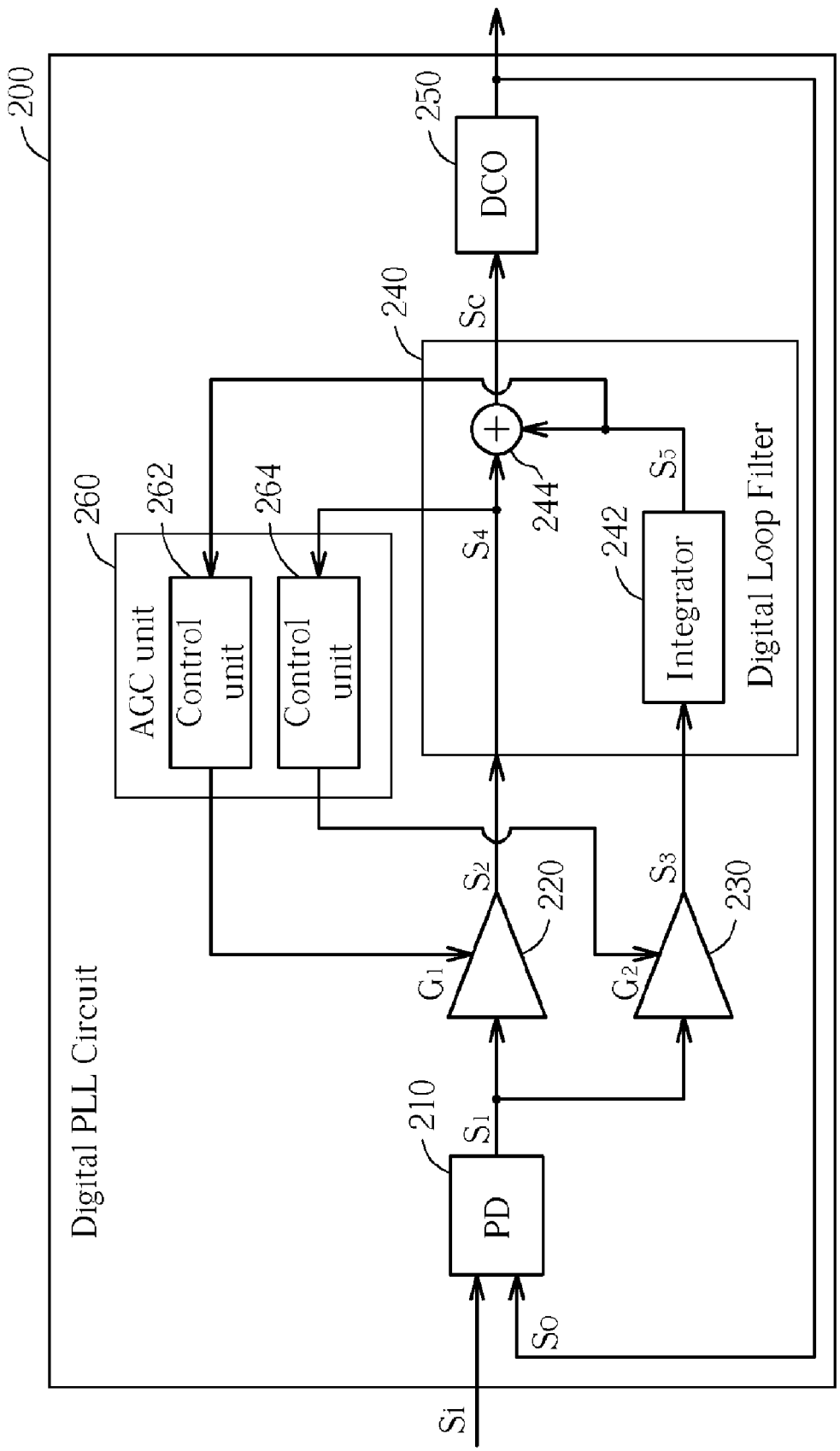
FIG. 2 is a block diagram of an auto-gain controlled digital phase-locked loop circuit according to a first embodiment of the present invention.

Please refer to FIG. 2. FIG. 2 is a block diagram of an auto-gain controlled digital phase-locked loop (PLL) circuit 200 according to a first embodiment of the present invention. As shown in FIG. 2, the PLL circuit 200 contains a phase detector (PD) 210, a plurality of multipliers 220 and 230, a digital loop filter 240, a digitally controlled oscillator (DCO) 250 and an auto-gain control (AGC) unit 260. The PD 210 detects a phase difference between an input signal $S_i$ and a clock signal $S_o$ to provide a phase difference signal $S_1$. The phase difference signal $S_i$ is fed into the multipliers 220 and 230 simultaneously. The multiplier 220 multiplies the phase difference signal $S_1$ by a first gain factor $G_1$ to generate a weighted signal $S_2$. Similarly, the multiplier 230 multiplies the phase difference signal $S_1$ by a second gain factor $G_2$ to generate a weighted signal $S_3$. In this embodiment, the AGC unit 260 is used to adapt the first gain factor $G_1$ and the second gain factor $G_2$. The weighted signals $S_2$ and $S_3$ are inputted to the digital loop filter 240 for generating a control signal $S_c$. The DCO 250 receives the control signal $S_c$ and outputs the clock signal $S_o$ having a frequency corresponding to the control signal $S_c$. The clock signal $S_o$ is further fed back to the PD 210. Please note that, as is well known in the art, the PLL circuit 200 can further comprise a frequency divider coupled between the PD 210 and the DCO 250.

The operation of the digital loop filter 240 will now be described. The digital loop filter 240 comprises an integrator 242 and an adder 244. The weighted signal $S_2$, after being inputted to the digital loop filter 240, is identified as a proportional signal $S_4$ within the digital loop filter 240. The integrator 242 integrates the weighted signal $S_3$ to generate an integral signal $S_5$. The adder 244 adds the integral signal $S_5$ and the proportional signal $S_4$ to generate the control signal $S_c$.

In this embodiment, the AGC unit 260 comprises a plurality of control units 262 and 264. The control unit 262 receives the integral signal $S_5$ in the digital loop filter 240 and adapts the first gain factor $G_1$ according to the integral signal $S_5$. On the other hand, the control unit 264 receives the proportional signal $S_4$ in the digital loop filter 240 and adapt the second gain factor $G_2$ according to the proportional signal $S_4$.

Figure 3:
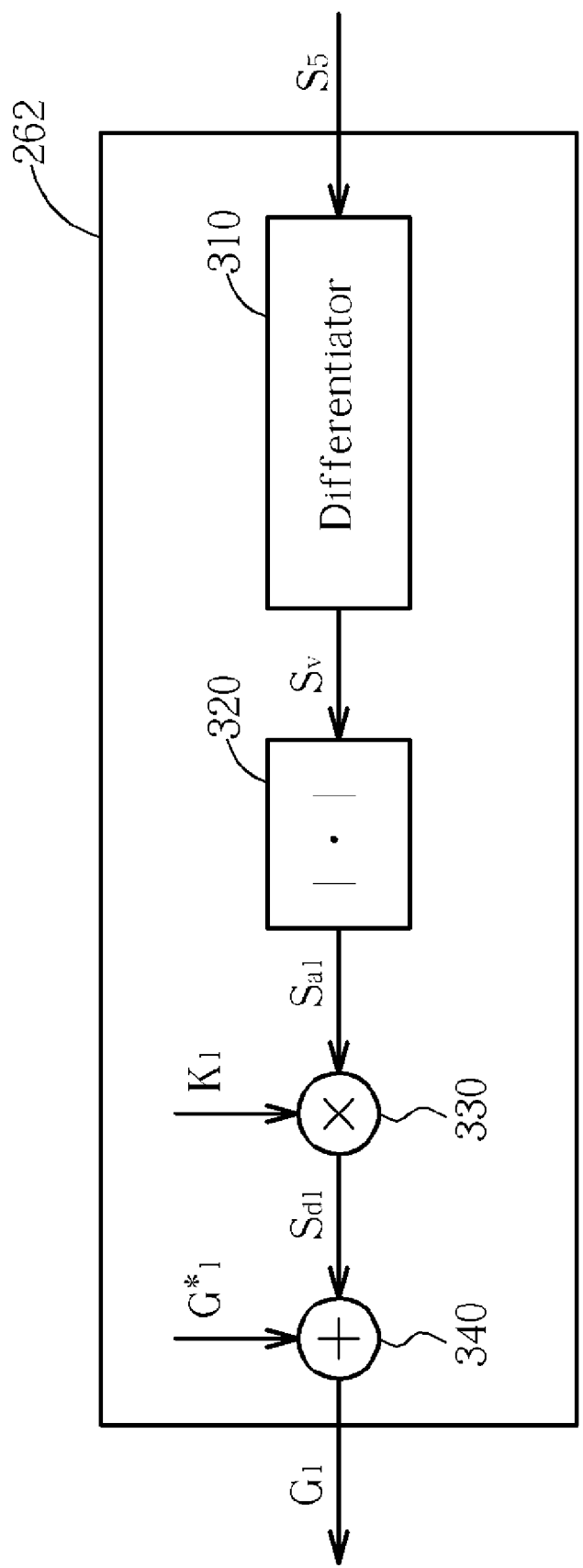
FIG. 3 is a block diagram illustrating a control unit shown in FIG. 2.

Please refer to FIG. 3. FIG. 3 is a block diagram illustrating the control unit 262 shown in FIG. 2. As shown in FIG. 3, the control unit 262 comprises a differentiator 310, an absolute value calculator 320, a multiplier 330, and an adder 340. The control unit 262 updates the first gain factor $G_1$ according to the following formula:

$$G_1 = K_1 \cdot |S_v| + G_1^* \qquad (1)$$

where $S_v = dS_5/dt$ is a variation signal, $G_1$ is the first gain factor, $K_1$ is a first preset value; $|S_v|$ is an absolute variation signal $S_{a1}$, and $G_1^*$ is a first preset minimal value.

The differentiator 310 receives the integral signal $S_5$ and differentiates the integral signal $S_5$ to provide the variation signal $S_v$. The variation signal $S_v$ represents a frequency variation at a time instant and the first gain factor $G_1$ is generated according to this calculated frequency variation. In this embodiment, the differentiator 310 is simplified to compute a difference between two successive values transmitted via the integral signal $S_5$, but this simplification is not meant to be a limitation of the present invention. The variation $S_v$ is fed into the absolute value calculator 320 for generating the absolute variation signal $S_{a1}$ according to the variation signal $S_v$. The absolute variation signal $S_{a1}$ is generated by taking absolute value over the variation signal $S_v$. Therefore, a value transmitted by the absolute variation signal $S_{a1}$ is an absolute value of a corresponding value transmitted by the variation signal $S_v$. The absolute variation signal $S_{a1}$ is then multiplied by the first preset value $K_1$ to generate a first difference signal $S_{d1}$. After adding the first preset minimal value $G_1^*$ to the first difference signal $S_{d1}$, the first gain factor $G_1$ is generated and is updated accordingly. Please note that the above-mentioned preset minimal value is for providing the first gain factor $G_1$ with a value related to a loop gain of the digital PLL 200. Further, since the operation of the multiplier 220 is equivalent to performing a scaling operation on the phase difference signal $S_1$, the gain factor $G_1$ set to the multiplier 220 is always a positive number.

Figure 4:
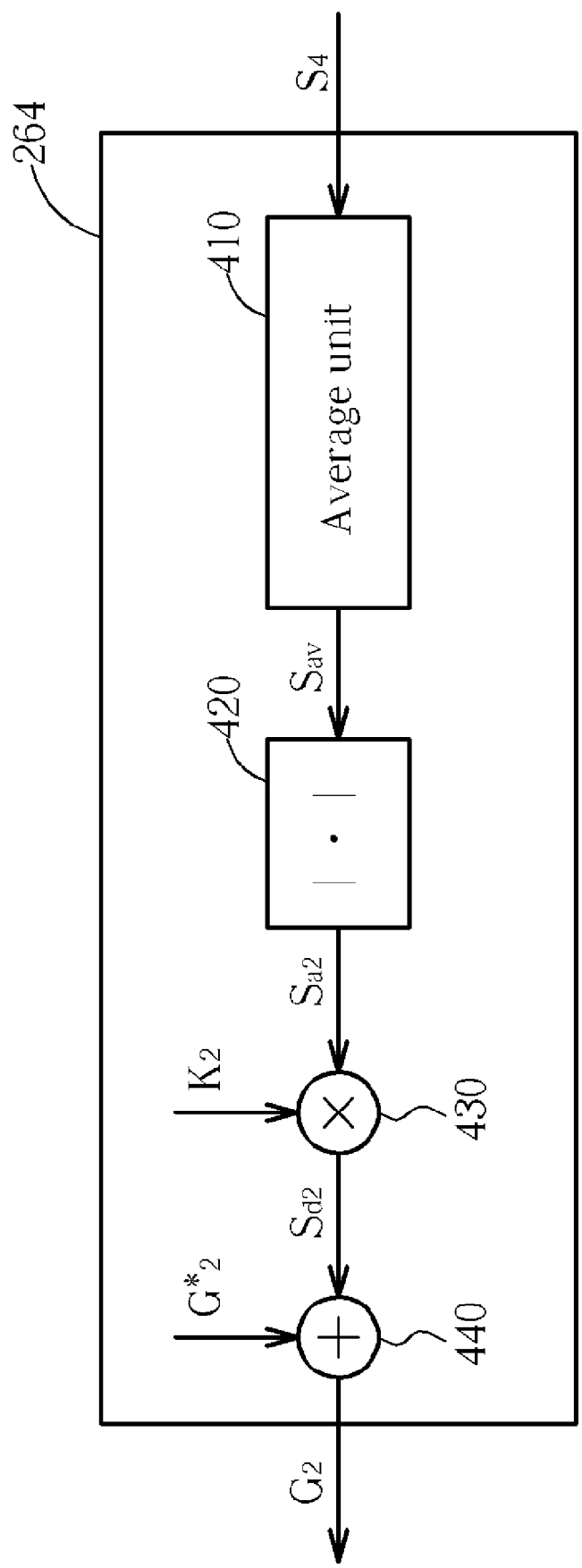
FIG. 4 is a block diagram illustrating another control unit shown in FIG. 2.

The control unit 264 generates the second gain factor $G_2$ in a similar way as that for the control unit 262 to generate the first gain factor $G_1$. Please refer to FIG. 4. FIG. 4 is a block diagram illustrating the control unit 264 shown in FIG. 2. As shown in FIG. 4, the control unit 264 comprises an average unit 410, an absolute value calculator 420, a multiplier 430, and an adder 440. The control unit 264 updates the second gain factor $G_2$ according to the following formula:

$$G_2 = K_2 \cdot |S_{av}| + G_2^* \qquad (2)$$

where $$S_{av} = \left( \sum_{m=n-N+1}^{n} S_4(m) \right) / N,$$

which acts like an a finite impulse response (FIR) low pass filter, is an averaged signal, $G_2$ is the second gain factor, $K_2$ is a second preset value, $|S_{av}|$ is an absolute averaged signal $S_{a2}$, $G_2^*$ is a second preset minimal value and N is a window size of a sliding window. Besides employing the FIR filter, the other way to form the averaged signal $S_{av}$ is to use an infinite impulse response (IIR) low pass filter. For example, the averaged signal $S_{av}$ can be obtained by calculating a running average of the proportional signal $S_4$.

The average unit 410 receives the proportional signal $S_4$ and averages values transmitted by the proportional signal $S_4$ over the sliding window to generate the averaged signal $S_{av}$. The averaged $S_{av}$ is fed into the absolute value calculator 420 for generating the absolute averaged signal $S_{a2}$ according to the averaged signal $S_{av}$. The absolute averaged signal $S_{a2}$ is generated by taking absolute value over the averaged signal $S_{av}$. Therefore, a value transmitted by the absolute averaged signal $S_{a2}$ is an absolute value of a corresponding value transmitted by the averaged signal $S_{av}$. Then, the absolute averaged signal $S_{a2}$ is multiplied by the second preset value $K_2$ to generate a second difference signal $S_{d2}$. After adding the second preset minimal value $G_2^*$ to the second difference signal $S_{d2}$, the second gain factor $G_2$ is acquired and is updated iteratively. Please note that the above-mentioned second preset minimal value is a value related to a natural frequency of the digital PLL 200. Further, since the operation of the multiplier 230 is equivalent to performing a scaling operation on the phase difference signal $S_1$, a second multiplier gain is always a positive number.

Figure 5:
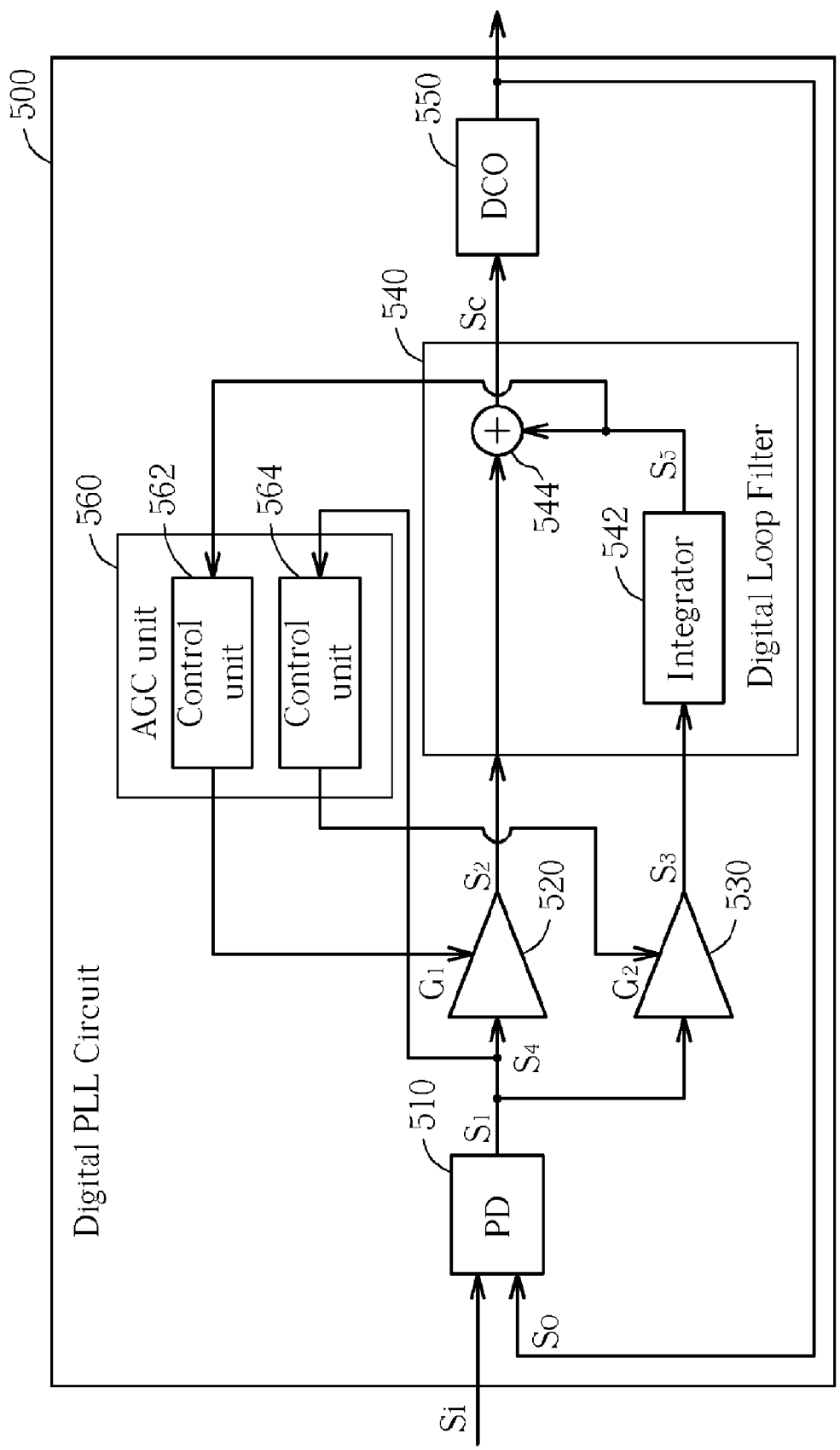
FIG. 5 is a block diagram of an auto-gain controlled digital phase-locked loop circuit according to a second embodiment of the present invention.

Please refer to FIG. 5. FIG. 5 is a block diagram of an auto-gain controlled digital phase-locked loop circuit 500 according to a second embodiment of the present invention. The auto-gain controlled digital PLL circuit 500 is similar to the digital PLL circuit 200 shown in FIG. 2 except that the phase difference signal $S_1$, rather than the proportional signal $S_4$, is inputted to the control unit 564. In this embodiment, the second preset value $K_2$ is modified to a suitable value to compensate for the fact that the inputted signal $S_1$ of the control unit 564 is not multiplied by a gain through the multiplier 520. Since the components of the same name in digital phase-locked loop circuits 200 and 500 have the same operation and functionality, further description is omitted for brevity.

The present invention, when used in an optical disc drive, can replace a conventional gain control mechanism applied to a digital PLL circuit. In other words, a conventional lookup table for determining a multiplier gain of a multiplier in the digital PLL circuit can be eliminated, and an auto-gain controlled digital PLL circuit as mentioned above is adopted instead. On the other hand, the present invention can be an auxiliary for a conventional gain control mechanism of a digital PLL circuit. When an optical disc drive fails to read an EFM signal from a disc, the above-mentioned auto-gain controlled mechanism is capable of supporting the following re-reading procedure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital phase-locked loop (PLL) system, comprising:
a phase detector, coupled to an input signal and a clock signal, for generating a phase difference signal indicating a phase difference between the input signal and the clock signal;
a first multiplier, coupled to the phase detector, for multiplying the phase difference signal by a first gain factor;
a second multiplier, coupled to the phase detector, for multiplying the phase difference signal by a second gain factor;
a digital loop filter, coupled to the first multiplier and the second multiplier, for providing an integral signal and a proportional signal according to outputs of the first multiplier and the second multiplier and for generating a control signal according to the integral signal and the proportional signal;
a digitally controlled oscillator, coupled to the digital loop filter, for generating the clock signal according to the control signal;
an auto-gain control (AGC) unit, coupled to the second multiplier and the digital loop filter, for updating the second gain factor according to the proportional signal.

2. The digital PLL system of claim 1, wherein the AGC unit comprises:
an average unit for averaging the proportional signal to generate an averaged signal;
an absolute value calculator coupled to the average unit for generating an absolute averaged signal representing an absolute value of the averaged signal;
a multiplier coupled to the absolute value calculator for multiplying the absolute averaged signal by a first preset value to generate a difference signal; and
an adder coupled to the multiplier for adding a second preset value to the difference signal to generate the second gain factor.

3. The digital PLL system of claim 2, wherein the average unit is a finite impulse response (FIR) low pass filter.

4. The digital PLL system of claim 2, wherein the average unit is an infinite impulse response (IIR) low pass filter.

5. The digital PLL system of claim 1, being applied to an optical disc drive.

6. A method for controlling a digital PLL system, comprising:
generating a phase difference signal according to an input signal and a clock signal;
multiplying the phase difference signal by a first gain factor through a first multiplier of the digital PLL system;
multiplying the phase difference signal by a second gain factor through a second multiplier of the digital PLL system;
performing digital loop filtering upon outputs of the first multiplier and the second multiplier for providing an integral signal and a proportional signal and for generating a control signal according to the integral signal and the proportional signal;
generating the clock signal according to the control signal through a digitally controlled oscillator of the digital PLL system; and
updating the second gain factor according to the proportional signal.

7. A digital phase-locked loop (PLL) system, comprising:
a phase detector, coupled to an input signal and a clock signal, for generating a phase difference signal indicating a phase difference between the input signal and the clock signal;
a first multiplier, coupled to the phase detector, for multiplying the phase difference signal by a first gain factor;
a second multiplier, coupled to the phase detector, for multiplying the phase difference signal by a second gain factor;
a digital loop filter, coupled to the first multiplier and the second multiplier, for providing an integral signal and a proportional signal according to outputs of the first multiplier and the second multiplier and for generating a control signal according to the integral signal and the proportional signal;
a digitally controlled oscillator, coupled to the digital loop filter, for generating the clock signal according to the control signal;
an auto-gain control (AGC) unit, coupled to the first multiplier and the digital loop filter, for updating the first gain factor according to the integral signal.

8. The digital PLL system of claim 7, wherein the AGC unit comprises:
a differentiator for differentiating the integral signal to generate a variation signal;

an absolute value calculator coupled to the differentiator for receiving the variation signal and generating an absolute variation signal representing an absolute value of the variation signal;

a multiplier coupled to the absolute value calculator for multiplying the absolute variation signal by a first preset value to generate a difference signal; and an adder coupled to the multiplier for adding a second preset value to the difference signal to generate the first gain factor.

9. The digital PLL system of claim 8, wherein the differentiator computes a difference between two successive values transmitted by the integral signal to form the variation signal.

10. The digital PLL system of claim 7, being applied to an optical disc drive.

11. A method for controlling a digital PLL system, comprising:

generating a phase difference signal according to an input signal and a clock signal;

multiplying the phase difference signal by a first gain factor through a first multiplier of the digital PLL system;

multiplying the phase difference signal by a second gain factor through a second multiplier of the digital PLL system;

performing digital loop filtering upon outputs of the first multiplier and the second multiplier for providing an integral signal and a proportional signal and for generating a control signal according to the integral signal and the proportional signal;

generating the clock signal according to the control signal through a digitally controlled oscillator of the digital PLL system; and updating the first gain factor according to the integral signal.

12. A digital phase-locked loop (PLL) system, comprising:

a phase detector, coupled to an input signal and a clock signal, for generating a phase difference signal indicating a phase difference between the input signal and the clock signal;

a first multiplier, coupled to the phase detector, for multiplying the phase difference signal by a first gain factor;

a second multiplier, coupled to the phase detector, for multiplying the phase difference signal by a second gain factor;

a digital loop filter, coupled to the first multiplier and the second multiplier, for providing an integral signal and a proportional signal according to outputs of the first multiplier and the second multiplier and for generating a control signal according to the integral signal and the proportional signal;

a digitally controlled oscillator, coupled to the digital loop filter, for generating the clock signal according to the control signal;

an auto-gain control (AGC) unit, coupled to the second multiplier and the phase detector, for updating the second gain factor according to the phase difference signal.

13. The digital PLL system of claim 12, wherein the AGC unit comprises:

an average unit for averaging the phase difference signal to generate an averaged signal;

an absolute value calculator coupled to the average unit for generating an absolute averaged signal representing an absolute value of the averaged signal;

a multiplier coupled to the absolute value calculator for multiplying the absolute averaged signal by a first preset value to generate a difference signal; and an adder coupled to the multiplier for adding a second preset value to the difference signal to generate the second gain factor.

14. The digital PLL system of claim 13, wherein the average unit is a FIR low pass filter.

15. The digital PLL system of claim 13, wherein the average unit is an IIR low pass filter.

16. The digital PLL system of claim 12, being applied to an optical disc drive.

17. A method for controlling a digital PLL system, comprising:

generating a phase difference signal according to an input signal and a clock signal;

multiplying the phase difference signal by a first gain factor through a first multiplier of the digital PLL system;

multiplying the phase difference signal by a second gain factor through a second multiplier of the digital PLL system;

performing digital loop filtering upon outputs of the first multiplier and the second multiplier for providing an integral signal and a proportional signal and for generating a control signal according to the integral signal and the proportional signal;

generating the clock signal according to the control signal through a digitally controlled oscillator of the digital PLL system; and updating the second gain factor according to the phase difference signal.

18. The method of claim 17, wherein the step of updating the second gain factor further comprises:

averaging the phase difference signal to generate an averaged signal;

generating an absolute averaged signal representing an absolute value of the averaged signal;

multiplying the absolute averaged signal by a first preset value to generate a difference signal; and updating the second gain factor by summing a second preset value and the difference signal.

19. The method of claim 18, wherein the averaged signal is generated by performing an FIR low pass filtering on the phase difference signal.

20. The method of claim 18, wherein the averaged signal is generated by performing an IIR low pass filtering on the phase difference signal.

21. The method of claim 17, wherein the digital PLL system is applied to an optical disc drive.

* * * * *